United States Patent [19]

Sitch

[11] Patent Number: 4,937,474
[45] Date of Patent: Jun. 26, 1990

[54] LOW POWER, HIGH NOISE MARGIN LOGIC GATES EMPLOYING ENHANCEMENT MODE SWITCHING FETS

[75] Inventor: John E. Sitch, Ottawa, Canada

[73] Assignee: Northern Telecom Limited, Montreal, Canada

[21] Appl. No.: 313,838

[22] Filed: Feb. 23, 1989

[51] Int. Cl.⁵ .......................................... H03K 17/30
[52] U.S. Cl. .................................. 307/448; 307/450; 307/475
[58] Field of Search ............... 307/448, 475, 443, 264, 307/585, 542, 559; 323/315

[56] References Cited

U.S. PATENT DOCUMENTS

| | | | |
|---|---|---|---|
| 4,663,543 | 5/1987 | Sitch | 307/448 |
| 4,743,782 | 5/1988 | Nelson et al. | 307/448 |
| 4,818,901 | 4/1989 | Young et al. | 307/443 |

*Primary Examiner*—Stanley D. Miller
*Assistant Examiner*—T. Cunningham
*Attorney, Agent, or Firm*—C. W. Junkin

[57] ABSTRACT

A low power, high noise margin logic gate comprises: an input terminal, an output terminal, and first and second voltage supply terminals; an enhancement mode switching FET having a gate connected to the input terminal, a source and a drain; a load device connected between the drain of the switching FET and the first voltage supply terminal; a feedback device connected between the source of the switching FET and the second voltage supply terminal; a two terminal level shift device connected between the drain of the switching FET and the output terminal; and an enhancement mode pulldown FET having a gate connected to the source of the switching FET, a source connected to the second voltage supply terminal, and a drain connected to the output terminal. The logic gate as defined above operates as an invertor. The logic gate may further comprise one or more additional enhancement mode switching FETs, each having a drain connected to the load device, a source connected to the feedback device, and a gate connected to a corresponding input terminal. With the additional switching FETs and input terminals, the logic gate functions as a NOR gate.

21 Claims, 6 Drawing Sheets

LOW POWER, HIGH NOISE MARGIN LOGIC GATES EMPLOYING ENHANCEMENT MODE SWITCHING FETS

FIELD OF THE INVENTION

This invention relates to logic gates having relatively low power consumption and relatively high noise margins. More particularly, this invention relates to low power, high noise margin logic gates which employ enhancement mode field effect switching transistors (FETs).

BACKGROUND OF THE INVENTION

A simple logic gate which employs enhancement mode switching FETs comprises an enhancement mode switching FET connected in series with a depletion mode load FET between two voltage supply terminals, an input terminal connected to the gate of the switching FET and an output terminal connected between the switching FET and the load FET. This logic gate operates as an invertor. If additional switching FETs are connected in parallel with the first switching FET and a corresponding input terminal is connected to the gate of each switching FET, a simple NOR gate is obtained. Circuits made up of such simple logic gates are known as Direct Coupled FET Logic (DCFL) circuits.

In order to function properly, DCFL logic circuits must be designed such that the output "logic low" level is below the threshold voltage of the enhancement mode switching FETs. While this may be relatively easy to achieve for silicon FETs which typically have threshold voltages of a few volts, it is more difficult to achieve for GaAs MESFETs which typically have threshold voltages which are an order of magnitude smaller. Moreover, because the threshold voltage is small, the noise margin of the "logic low" level is also small.

The "logic high" level of a DCFL logic gate is limited by the output current which flows into downstream logic gates. Thus, a DCFL logic gate which is connected to several downstream logic gates in parallel may have a "logic high" level which is close to its "logic low" level. In this case, noise margin of the "logic high" level will also be small.

The noise margins of DCFL gates can be improved by adding a level shifting buffer stage at the output of each gate. The level shifting buffer stage shifts the output level lower to improve the noise margin of the "logic low" level, and buffers the output to reduce the impact of fanout on the "logic high" level. However, the level shifting buffer stage significantly increases the power consumption of the logic gate. Thus, the improved noise margins are achieved at the expense of a significant power consumption penalty. Moreover, most known level shifting buffer stages require a supply voltage which differs from the supply voltages applied to the switching stage. The requirement for a third supply voltage complicates the design and increases the cost of circuits employing buffered gates.

SUMMARY OF THE INVENTION

This invention seeks to provide logic gates which employ enhancement mode switching FETs and which have noise margins comparable to those provided by logic gates having level shifting buffer stages, but which have lower power consumption than those logic gates having level shifting buffer stages.

A logic gate according to the invention comprises an input terminal, an output terminal, and first and second voltage supply terminals; an enhancement mode switching FET having a gate connected to the input terminal, a source and a drain; a load device connected between the drain of the switching FET and the first voltage supply terminal; a feedback device connected between the source of the switching FET and the second voltage supply terminal; a two terminal level shift device connected between the drain of the switching FET and the output terminal; and an enhancement mode pulldown FET having a gate connected to the source of the switching FET, a source connected to the second voltage supply terminal, and a drain connected to the output terminal.

The load device may be a depletion mode FET having a drain which is connected to the first voltage supply terminal, and a gate and source, both of which are connected to the drain of the switching FET. Alternatively, the load device may be a linear or nonlinear resistance.

The feedback device may be an enhancement mode FET having a source which is connected to the second voltage supply terminal, and a gate and drain, both of which are connected to the source of the switching FET. Alternatively, the feedback device may be a depletion mode FET having a drain which is connected to the source of the switching FET, a source, which is connected to the second voltage supply terminal, and a gate which is connected to either the source or the drain. The feedback device may also be a diode, a plurality of diodes connected in series, or a linear or nonlinear resistance.

The two terminal level shift device may be a diode or a plurality of diodes connected in series. Alternatively, the two terminal level shift device may be a linear or nonlinear resistance, or may be an enhancement mode FET with its gate and drain connected to the drain of the switching FET and its source connected to the output terminal.

The logic gate as defined above operates as an invertor. The logic gate may further comprise one or more additional enhancement mode switching FETs, each having a drain connected to the load device, a source connected to the feedback device, and a gate connected to a corresponding input terminal. With the additional switching FETs and input terminals, the logic gate functions as a NOR gate.

The two terminal level shift device of the logic gate according to the invention shifts the output "logic low" level down while the feedback device effectively shifts the threshold voltage of the switching FET to a level which is further from the supply voltage at the second voltage supply terminal to ensure that the "logic low" level is well below the effective threshold voltage of the switching FETs of downstream gates. Moreover, the feedback device also shifts the output "logic high" level higher by increasing the effective input impedance of downstream gates. Thus the logic gate according to the invention has better noise margins than DCFL gates.

Moreover, because the load current is split between the switching FET and the pulldown FET when the switching FET is on, the switching FET can be made narrower than in DCFL and buffered gates to reduce the power consumption by an amount which is greater than the power consumption of the level shift device, feedback device and pulldown FET. Hence, the logic gate according to the invention provides good noise margins with relatively low power consumption.

Furthermore, the logic gate according to the invention requires only two voltage supply levels in contrast to some high noise margin buffered gate designs which require three voltage supply levels.

BRIEF DESCRIPTION OF THE DRAWINGS

Embodiments of the invention are described below by way of example only with reference to the accompanying drawings, in which.

DETAILED DESCRIPTION OF EMBODIMENTS

Figure 1:
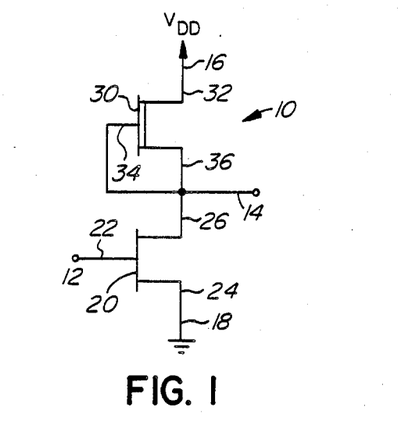
FIG. 1 is a schematic diagram of a direct coupled FET invertor.

FIG. 1 is a schematic diagram of a direct coupled FET invertor 10. The invertor 10 comprises an input terminal 12, an output terminal 14, a first voltage supply terminal 16 for connection to a positive supply voltage $V_{DD}$, and a second voltage supply terminal 18 for connection to ground. The invertor 10 further comprises an enhancement mode switching FET 20 having a gate 22 connected to the input terminal 12, a source 24 connected to the second voltage supply terminal 18, and a drain 26 connected to the output terminal 14. The invertor 10 also comprises a depletion mode load FET 30 having a drain 32 connected to the first voltage supply terminal 16, and a gate 34 and source 36 connected to the drain 26 of the switching FET 20.

When a voltage which is less than the threshold voltage of the switching FET 20 is applied to the input terminal 12 of the invertor 10, the switching FET 20 is off and the load FET 30, which is always on, pulls the voltage of the output terminal 14 to a "logic high" level. The "logic high" level is limited by the positive supply voltage $V_{DD}$ and by the effective input impedance of downstream gates which, together with the load FET 30 act as a voltage divider to determine the "logic high" level. If the positive supply voltage $V_{DD}$ is low or the effective input impedance of downstream gates is small relatively small (as will be the case when several gates are connected in parallel to the output terminal 14 of the invertor 10), the "logic high" level will be close to the threshold voltage of the switching FETs 20 of downstream gates, and the "logic high" level will have a small noise margin.

When a voltage which exceeds the threshold voltage of the switching FET 20 is applied to the input terminal 12, the switching FET 20 turns on, and the switching FET 20 and the load FET 30 act as a voltage divider to determine the voltage on the output terminal 14. The resulting output voltage is a "logic low" for succeeding stages only if it is less than the threshold voltage of the switching FET 20.

Where the switching FET 20 is a GaAs MESFET, the threshold voltage is approximately 0.25 volt. Thus, for a typical supply voltage of $V_{DD}=2.5V$, the on-state impedance of the switching FET 20 must be made less than one tenth the on-state impedance of the load FET 30. This is typically accomplished by making the channel of the switching FET 20 approximately three times wider than the channel of the load FET 30 and by arranging for the "logic high" level to exceed the threshold voltage of the switching FET 20 by an amount sufficient to ensure that a "logic high" input turns the switching FET 20 fully on. This places constraints on the "logic high" level which further limit the noise margin of that level. Moreover, because the resulting "logic low" voltage level is very close to the threshold voltage of the switching FET 20, the noise margin of the "logic low" is also very small when GaAs MESFETs 20, 30 are used.

Figure 2:
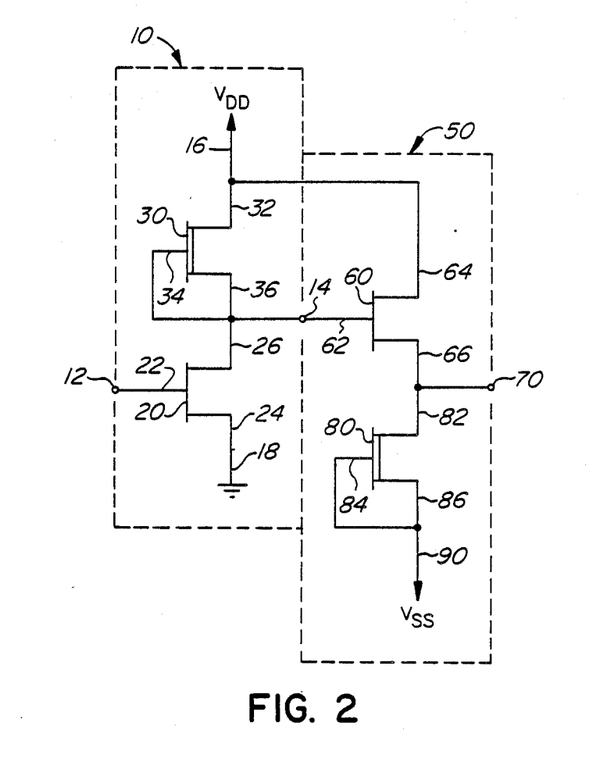
FIG. 2 is a schematic diagram of a buffered FET invertor.

FIG. 2 is a schematic diagram of a buffered FET invertor which comprises the invertor 10 described above, and a level shifting buffer stage 50 connected to the output terminal 14 of the invertor 10. The level shifting buffer stage 50 comprises an enhancement mode FET 60 having a gate 62 which is connected to the output terminal 14 of the invertor 10, a drain 64 which is connected to the positive voltage supply terminal 16 and a source 66 which is connected to a buffer stage output terminal 70. The level shifting buffer stage further comprises a depletion mode FET 80 which has a drain 82 which is connected to the buffer stage output terminal 70, and a gate 84 and source 86 which are both connected to a negative voltage supply terminal 90 for connection to a negative supply voltage $V_{SS}$.

When a voltage which is less than the threshold voltage of the switching FET 20 is applied to the input terminal 12 of the invertor 10, the switching FET 20 is off and the load FET 30, which is always on, pulls the voltage of node 14 to a level close to the positive supply voltage $V_{DD}$. This causes FET 60 to turn on, and FETs 60, 80 of the buffer stage and the effective input impedance of downstream gates act as a voltage divider to determine the voltage on the output terminal 70. The channel of FET 60 is made wider than the channel of FET 80 to ensure that the voltage on the output terminal 70 is considerably larger than the threshold voltage of the switching FET 20 when a voltage less than the threshold voltage of the switching FET 20 is applied to the input terminal 12, even when the effective input impedance of downstream gates is relatively low. This ensures that the voltage on the output terminal 70 will act as a "logic high" for succeeding logic gates which employ switching FETs similar to the FET 20, and that the noise margins for this state will be acceptably large.

When a voltage which exceeds the threshold voltage of the switching FET 20 is applied to the input terminal 12, the switching FET 20 turns on, and the switching FET 20 and the load FET 30 act as a voltage divider to determine the voltage on the node 14. If the voltage on the node 14 is low enough, the FET 60 turns off and the FET 80, which is always on, pulls the voltage on the output terminal 70 toward the negative supply voltage $V_{SS}$. The resulting output voltage is considerably lower than the threshold voltage of the switching FET 20 and will act as a "logic low" for succeeding logic gates which employ switching FETs similar to the FET 20. Indeed, the "logic low" level can be below ground so that the noise margin for this state is acceptably large in spite of the low threshold voltage of the switching FET 20.

Unfortunately, in the buffered invertor shown in FIG. 2, the switching FET 20 must still be made wider than the load FET 30 in order to ensure that the voltage on the node 14 when the switching FET 20 is on is low enough to turn off the FET 60 of the buffer stage 50. In particular, the FET 20 must be made roughly twice as wide as the load FET 30. As the minimum dimensions of the load FET 30 are determined by processing considerations, a large switching FET 20 is required. Moreover, the level shifting buffer stage 50 increases the power consumption of the buffered invertor. Thus, the addition of the level shifting buffer stage 50 improves the noise margins and drive capability of the invertor 10, but significantly increases the power consumption of the resulting buffered invertor. The power consumption of the buffered invertor is approximately 1.0 mW when implemented in 1 micron GaAs MESFET technology with a minimum transistor width of 3 microns.

The buffered invertor also requires three voltage supply levels in contrast to the two voltage supply levels required by the direct coupled FET invertor 10 shown in FIG. 1. This complicates the design and increases the cost of circuits using the buffered FET invertor.

Figure 3:
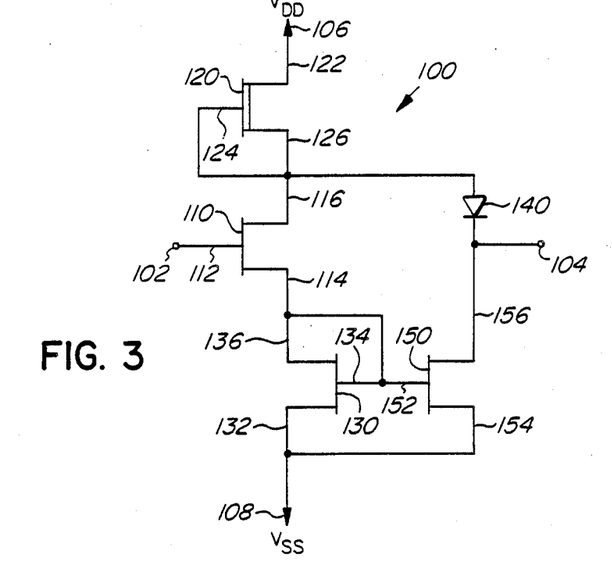
FIG. 3 is a schematic diagram of an invertor according to a first embodiment.

FIG. 3 is a schematic diagram of a logic gate according to a first embodiment in the form of an invertor 100. The invertor 100 comprises an input terminal 102, an output terminal 104, a first voltage supply terminal 106 for connection to a positive voltage supply $V_{DD}$, and a second voltage supply terminal 108 for connection to a negative voltage supply $V_{SS}$. The invertor 100 further comprises an enhancement mode switching FET in the form of a GaAs MESFET 110 having a gate 112 which is connected to the input terminal 102, a source 114 and a drain 116. A load device of the invertor 100 comprises a depletion mode GaAs MESFET 120 having a drain 122 which is connected to the first voltage supply terminal 106, and a gate 124 and a source 126, both of which are connected to the drain 116 of the switching FET 110. A feedback device of the invertor 100 comprises an enhancement mode GaAs MESFET 130 having a source 132 which is connected to the second voltage supply terminal 108 and a gate 134 and drain 136, both of which are connected to the source 114 of the switching FET 110. A two terminal level shift device of the invertor 100 comprises a diode 140 connected between the drain 116 of the switching FET 110 and the output terminal 104. The invertor 100 further comprises an enhancement mode pulldown GaAs MESFET 150 having a gate 152 which is connected to the source 114 of the switching FET 110, a source 154 which is connected to the second voltage supply terminal 108, and a drain 156 which is connected to the output terminal 104.

When a "logic low" voltage is applied to the input terminal 102, the switching FET 110 is off, so the feedback FET 130 and the pulldown FET 150 are also off. The load FET 120, which is always on, together with the diode 140 and the effective input impedance of downstream gates act as a voltage divider to determine the voltage on the output terminal 104. However, the feedback and pulldown FETs 130,150 of the downstream gates increase the effective input impedance of the downstream gates to a value which is higher than the effective input impedance of DCFL gates such as the invertor 10 which lack these components. Consequently, the output "logic high" level for the invertor 100 is higher than the output "logic high" level for the DCFL invertor 10 when each is connected to an equivalent complement of similar downstream gates. As a result, the noise margin for the "logic high" level of the invertor 100 is larger than the noise margin for the "logic high" level of the DCFL invertor 10.

Figure 9:
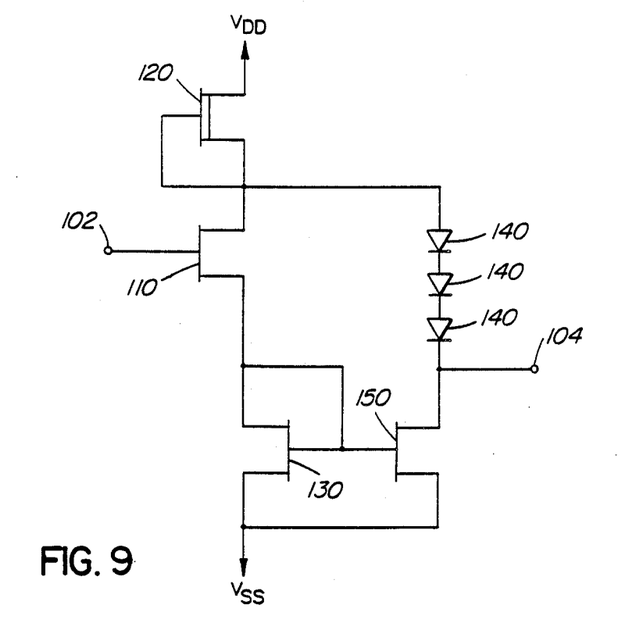
FIG. 9 is a schematic diagram of an invertor according to another embodiment.

When a "logic high" level is applied to the input terminal 102, the switching FET 110 turns on, thereby turning on the feedback FET 130 and the pulldown FET 150. The load FET 120 and the switching FET 110, feedback FET 130, diode 140, and pulldown FET 150 act as a voltage divider to determine the voltage on the drain 116 of the switching FET 110. The diode 140 and the pulldown FET 150 act as a voltage divider which fixes the voltage on the output terminal 104 at a "logic low" level. The pulldown FET 150 pulls the voltage on the output terminal 104 toward the negative supply voltage $V_{SS}$, and the diode 140 provides the required voltage shift between the drain 116 of the switching FET 110 and the output terminal 104. If a greater voltage shift between the drain 116 of the switching FET 110 and the output terminal 104 is desired for improved noise margins, the diode 140 can be replaced by a plurality of series connected diodes as shown in FIG. 9.

Because the current drawn by the load FET 120 is divided between the switching FET 110 in series with the feedback FET 130 and the diode 140 in series with the pulldown FET 150, and because of the level shifting effect of the diode 140, an acceptably low "logic low" output voltage can be achieved even when all of the FETs 110, 120, 130, 150 have substantially the same channel width. Hence all of the FETs can be made as small as the fabrication technology will permit. Consequently, the power consumption of the resulting invertor 100 is substantially lower than that of the buffered FET invertor shown in FIG. 2. The power consumption of the invertor 100 is approximately 0.25 mW when implemented in 1 micron GaAs MESFET technology using minimum transistor widths of 3 microns, significantly lower than the power consumption of the buffered FET invertor shown in FIG. 2 when implemented in the same technology.

Moreover, the level shifting diode 140 shifts the output "logic low" level down and the feedback and pulldown FETs 130, 150 shift the input "logic high" level up to increase the voltage swing and hence the available noise margins of the invertor 100. Indeed, the logic levels and noise margins of the invertor 100 can be made compatible with the logic levels and noise margins of the buffered FET invertor shown in FIG. 2, so that the devices can be combined in a common circuit. The invertor 100 can be used where output drive is not important to reduce power consumption, and the buffered invertor of FIG. 2 can be used to provide greater output drive where required at the expense of higher power consumption.

The invertor 100 also requires only positive and negative supply voltages $V_{DD}$ and $V_{SS}$. The elimination of the ground connection required for the buffered FET invertor of FIG. 2 simplifies the design of circuits using the invertor 100.

Figure 4:
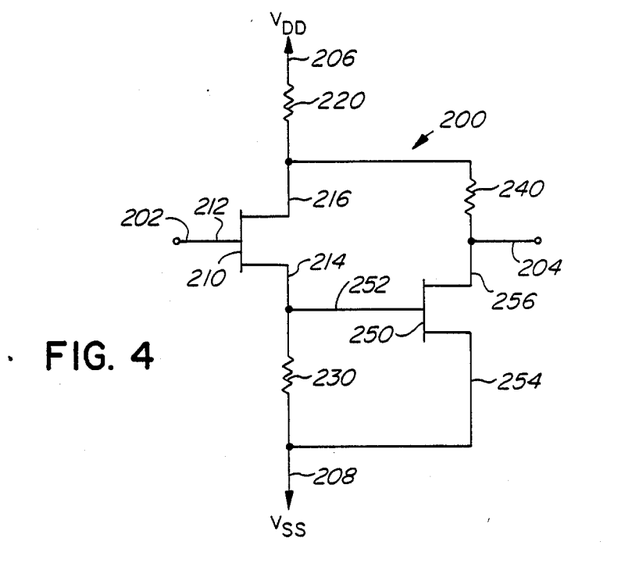
FIG. 4 is a schematic diagram of an invertor according to a second embodiment.

FIG. 4 is a schematic diagram of a logic gate according to a second embodiment in the form of an invertor 200. The invertor 200 comprises an input terminal 202, an output terminal 204, a first voltage supply terminal 206 for connection to a positive voltage supply $V_{DD}$, and a second voltage supply terminal 208 for connection to a negative voltage supply $V_{SS}$. The invertor 200 further comprises an enhancement mode switching FET in the form of a GaAs MESFET 210 having a gate 212 which is connected to the input terminal 202, a source 214 and a drain 216. A load device of the invertor 200 comprises a resistor 220 which is connected between the first voltage supply terminal 206 and the drain 216 of the switching FET 210. A feedback device of the invertor 200 comprises another resistor 230 which is connected between the second voltage supply terminal 208 and the source 214 of the switching FET 210. A two terminal level shift device of the invertor 200 comprises another resistor 240 connected between the drain 216 of the switching FET 210 and the output terminal 204. The invertor 200 further comprises an enhancement mode pulldown GaAs MESFET 250 having a gate 252 which is connected to the source 214 of the switching FET 210, a source 254 which is connected to the second voltage supply terminal 208, and a drain 256 which is connected to the output terminal 204.

When a "logic low" voltage is applied to the input terminal 202, the switching FET 210 is off, so no current flows through the feedback resistor 230 and the pulldown FET 250 is also off. The load FET 220, which is always on, together with the level shift resistor 240 and the effective input impedance of downstream gates act as a voltage divider to determine the voltage on the output terminal 204. However, the feedback resistor 230 and the pulldown FET 250 of the downstream gates increase the effective input impedance of the downstream gates to a value which is higher than the effective input impedance of DCFL gates such as the invertor 10 which lack these components. Consequently, the output "logic high" level for the invertor 200 is higher than the output "logic high" level for the DCFL invertor 10 when each is connected to an equivalent complement of similar downstream gates. As a result, the noise margin for the "logic high" level of the invertor 200 is larger than the noise margin for the "logic high" level of the DCFL invertor 10.

When a "logic high" level is applied to the input terminal 202, the switching FET 210 turns on, thereby supplying enough current to feedback resistor 230 to turn on the pulldown FET 250. The load resistor 220 and the switching FET 210, feedback resistor 230, level shift resistor 240, and pulldown FET 250 act as a voltage divider to determine the voltage on the drain 216 of the switching FET 210. The level shift resistor 240 and the pulldown FET 250 act as a voltage divider which fixes the voltage on the output terminal 204 at a "logic low" level. The pulldown FET 250 pulls the voltage on the output terminal 204 toward the negative supply voltage $V_{SS}$, and the level shift resistor 240 provides the required voltage shift between the drain 216 of the switching FET 210 and the output terminal 204. If a greater voltage shift between the drain 216 of the switching FET 210 and the output terminal 204 is desired for improved noise margins, the resistance of the level shift resistor 204 can be increased.

Because the current drawn by the load FET 220 is divided between the switching FET 210 in series with the feedback resistor 230 and the level shift resistor 240 in series with the pulldown FET 250, and because of the level shifting effect of the resistor 240, an acceptably low "logic low" output voltage can be achieved even when the switching FET 210 is made with the minimum channel width which fabrication technology will permit. Consequently, the power consumption of the resulting invertor 200 can be made substantially lower than that of the buffered FET invertor shown in FIG. 2. Moreover, the level shifting resistor 240 shifts the output "logic low" level down and the feedback resistor 230 and the pulldown FET 250 shift the input "logic high" level up to increase the voltage swing and hence the available noise margins of the invertor 200. The invertor 200 also requires only positive and negative supply voltages $V_{DD}$ and $V_{SS}$. Any or all of the resistors 220, 230, 240 may be non-linear resistors.

Figure 5:
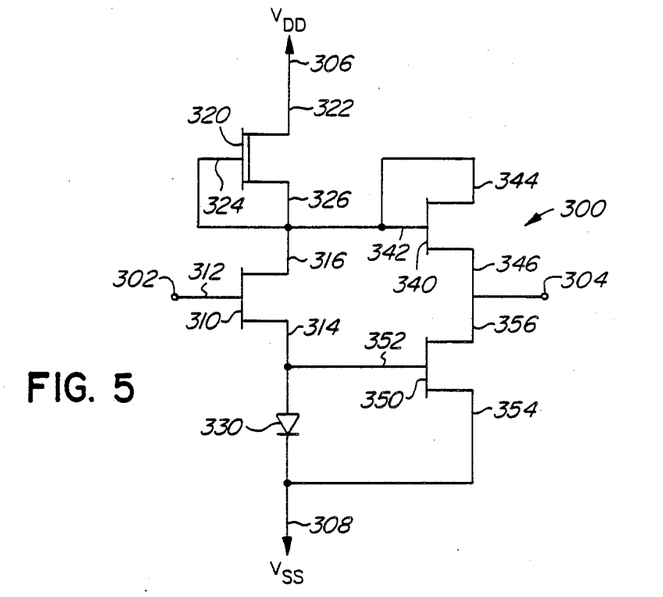
FIG. 5 is a schematic diagram of an invertor according to a third embodiment.

FIG. 5 is a schematic diagram of a logic gate according to a third embodiment in the form of an invertor 300. The invertor 300 comprises an input terminal 302, an output terminal 304, a first voltage supply terminal 306 for connection to a positive voltage supply $V_{DD}$, and a second voltage supply terminal 308 for connection to a negative voltage supply $V_{SS}$. The invertor 300 further comprises an enhancement mode switching FET in the form of a GaAs MESFET 310 having a gate 312 which is connected to the input terminal 302, a source 314 and a drain 316. A load device of the invertor 300 comprises a depletion mode GaAs MESFET 320 having a drain 322 which is connected to the first voltage supply terminal 306, and a gate 324 and a source 326, both of which are connected to the drain 316 of the switching FET 310. A feedback device of the invertor 300 comprises a diode 330 which is connected between the second voltage supply terminal 208 and the source 314 of the switching FET 310. A two terminal level shift device of the invertor 300 comprises an enhancement mode GaAs MESFET 340 having a gate 342 and a drain 344 which are connected to the drain 316 of the switching FET 310 and a source 346 which is connected to the output terminal 304. The invertor 300 further comprises an enhancement mode pulldown GaAs MESFET 350 having a gate 352 which is connected to the source 314 of the switching FET 310, a source 354 which is connected to the second voltage supply terminal 308, and a drain 356 which is connected to the output terminal 304. When a "logic low" voltage is applied to the input terminal 302, the switching FET 310 is off, so no current flows through the feedback diode 330 and the pulldown FET 350 is also off. The load FET 320, which is always on, together with the level shift FET 340 and the effective input impedance of downstream gates act as a voltage divider to determine the voltage on the output terminal 304. However, the feedback diode 330 and the pulldown FET 350 of the downstream gates increase the effective input impedance of the downstream gates to a value which is higher than the effective input impedance of DCFL gates such as the invertor 10 which lack these components. Consequently, the output "logic high" level for the invertor 300 is higher than the output "logic high" level for the DCFL invertor 10 when each is connected to an equivalent complement of similar downstream gates. As a result, the noise margin for the "logic high" level of the invertor 300 is larger than the noise margin for the "logic high" level of the DCFL invertor 10.

When a "logic high" level is applied to the input terminal 302, the switching FET 310 turns on, thereby supplying enough current to feedback diode 330 to turn on the pulldown FET 350. The load FET 320 and the switching FET 310, feedback diode 330, level shift FET 340, and pulldown FET 350 act as a voltage divider to determine the voltage on the drain 316 of the switching FET 310. The level shift FET 340 and the pulldown FET 350 act as a voltage divider which fixes the voltage on the output terminal 304 at a "logic low" level. The pulldown FET 350 pulls the voltage on the output terminal 304 toward the negative supply voltage $V_{SS}$, and the level shift FET 340 provides the required voltage shift between the drain 316 of the switching FET 310 and the output terminal 304.

Figure 8:
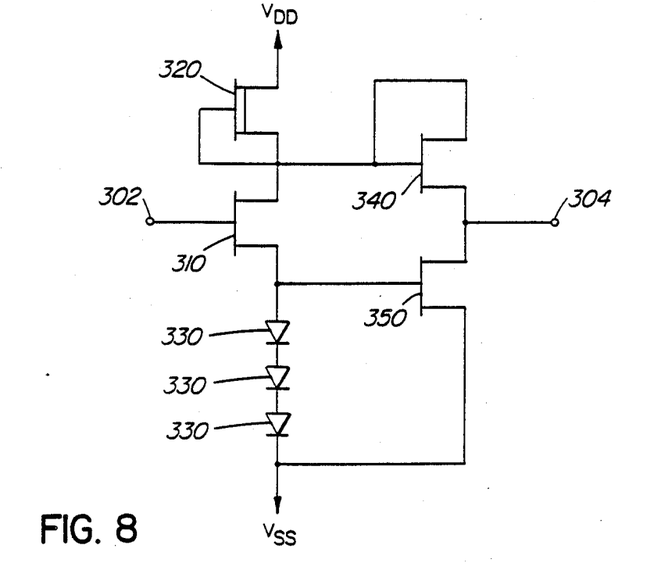
FIG. 8 is a schematic diagram of an invertor according to another embodiment.

Because the current drawn by the load FET 320 is divided between the switching FET 310 in series with the feedback diode 330 and the level shift FET 340 in series with the pulldown FET 350, and because of the level shifting effect of the FET 340, an acceptably low "logic low" output voltage can be achieved even when the switching FET 310 is made with the minimum channel width which fabrication technology will permit. Consequently, the power consumption of the resulting invertor 300 can be made substantially lower than that of the buffered FET invertor shown in FIG. 2. Moreover, the level shifting FET 340 shifts the output "logic low" level down and the feedback diode 330 and the pulldown FET 350 shift the input "logic high" level up to increase the voltage swing and hence the available noise margins of the invertor 300. The invertor 300 also requires only positive and negative supply voltages $V_{DD}$ and $V_{SS}$. The feedback diode 330 may be replaced with a plurality of series connected diodes as shown in FIG. 8 if required to ensure turn-on of the pulldown FET 350 when the switching FET 310 turns on.

Figure 6:
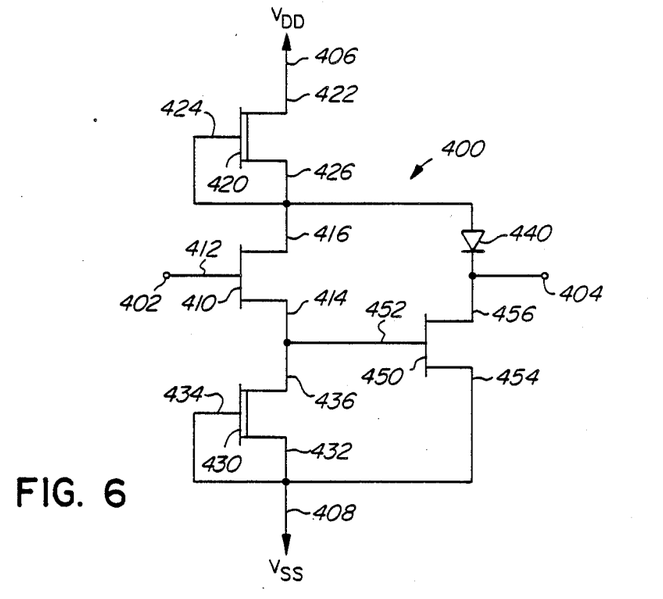
FIG. 6 is a schematic diagram of an invertor according to a fourth embodiment.

FIG. 6 is a schematic diagram of a logic gate according to a fourth embodiment in the form of an invertor 400. The invertor 400 comprises an input terminal 402, an output terminal 404, a first voltage supply terminal 406 for connection to a positive voltage supply $V_{DD}$, and a second voltage supply terminal 408 for connection to a negative voltage supply $V_{SS}$. The invertor 400 further comprises an enhancement mode switching FET in the form of a GaAs MESFET 410 having a gate 412 which is connected to the input terminal 402, a source 414 and a drain 416. A load device of the invertor 400 comprises a depletion mode GaAs MESFET 420 having a drain 422 which is connected to the first voltage supply terminal 406, and a gate 424 and a source 426, both of which are connected to the drain 416 of the switching FET 410. A feedback device of the invertor 400 comprises a depletion mode GaAs MESFET 430 having a source 432 and a gate 434 which are both connected to the second voltage supply terminal 408, and a drain 436 which is connected to the source 414 of the switching FET 410. A two terminal level shift device of the invertor 400 comprises a diode 440 connected between the drain 416 of the switching FET 410 and the output terminal 404. The invertor 400 further comprises an enhancement mode pulldown GaAs MESFET 450 having a gate 452 which is connected to the source 414 of the switching FET 410, a source 454 which is connected to the second voltage supply terminal 408, and a drain 456 which is connected to the output terminal 404.

The invertor 400 operates in essentially the same manner as the invertor 100 shown in FIG. 3, except that the feedback device is a depletion mode FET 430 which pulls the gate 452 of the pulldown FET 450 toward $V_{SS}$ when the switching FET 410 is off to turn off the pulldown FET 450 and which provides a voltage drop sufficient to turn the pulldown FET 450 on when the switching FET 410 is on.

Figure 10:
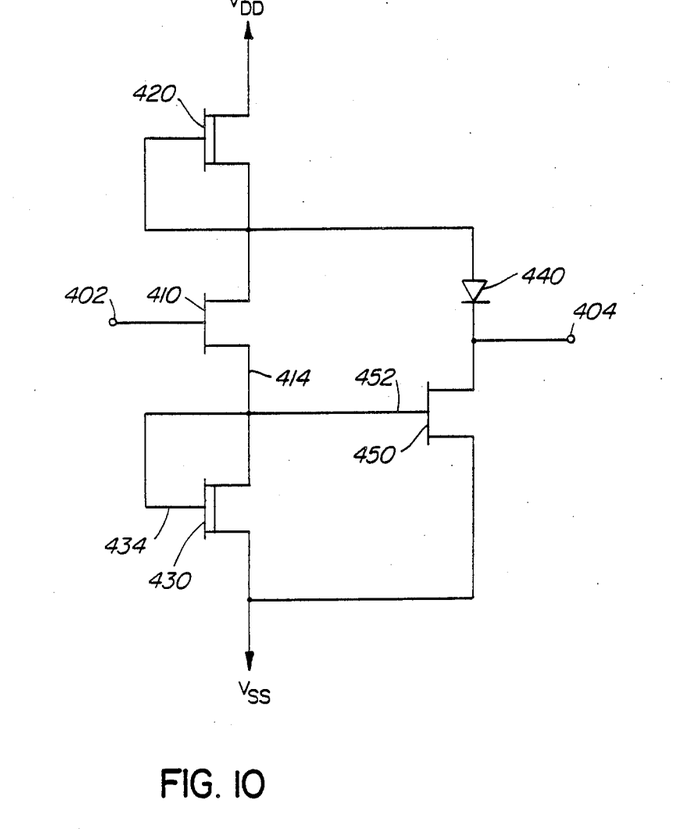
FIG. 10 is a schematic diagram of an invertor according to another embodiment.

In the invertor 400, the gate 434 of the depletion mode feedback FET may be connected to its drain 436 instead of its source 432 as shown in FIG. 10.

Figure 7:
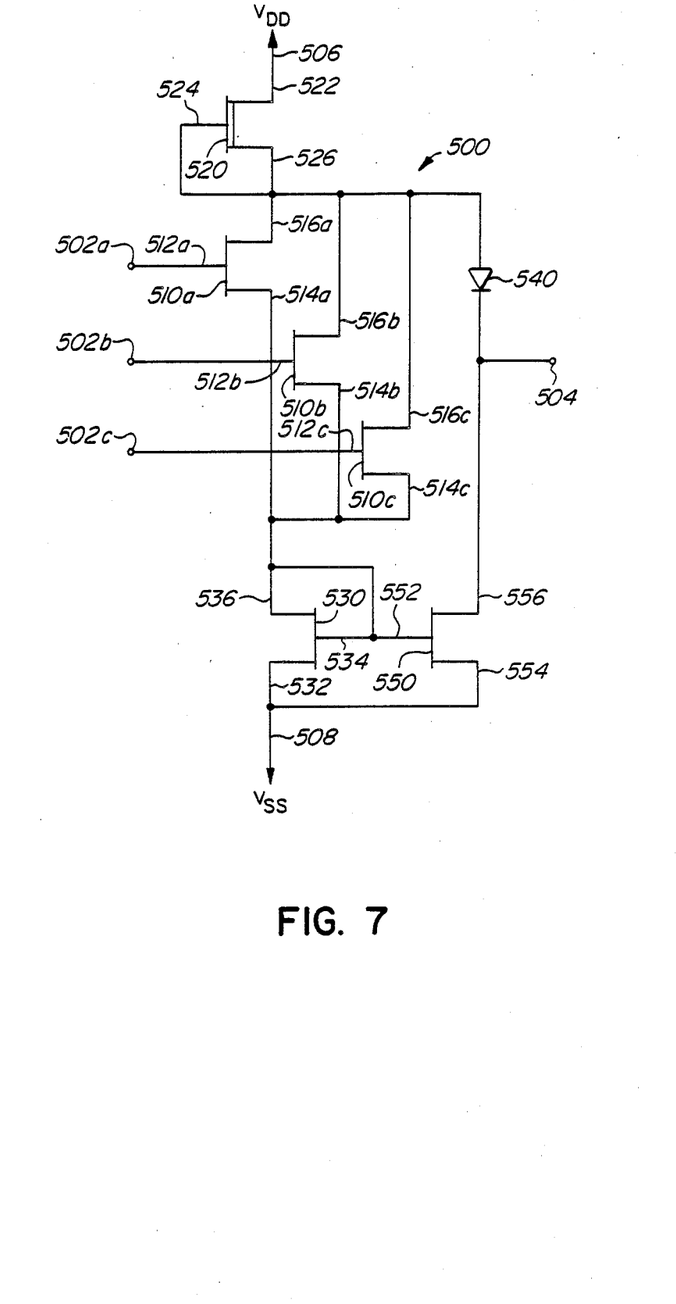
FIG. 7 is a schematic diagram of a NOR gate according to a fifth embodiment.

FIG. 7 is a schematic diagram of a logic gate according to a first embodiment in the form of a NOR gate 500. The NOR gate 500 comprises three input terminals 502a–c, an output terminal 504, a first voltage supply terminal 506 for connection to a positive voltage supply $V_{DD}$, and a second voltage supply terminal 508 for connection to a negative voltage supply $V_{SS}$. The NOR gate 500 further comprises three enhancement mode switching FETs in the form of GaAs MESFETs 510a–c, each having a gate 512 which is connected to a corresponding one of the input terminals 502a–c, a source 514 connected to the sources 514 of each of the other switching FETs, and a drain 516 connected to the drains 516 of each of the other switching FETs. A load device of the NOR gate 500 comprises a depletion mode GaAs MESFET 520 having a drain 522 which is connected to the first voltage supply terminal 506, and a gate 524 and a source 526, both of which are connected to the drains 516 of the switching FETs 510a–c. A feedback device of the NOR gate 500 comprises an enhancement mode GaAs MESFET 530 having a source 532 which is connected to the second voltage supply terminal 508 and a gate 534 and drain 536, both of which are connected to the sources 514a–c of the switching FETs 510a–c. A two terminal level shift device of the NOR gate 500 comprises a diode 540 connected between the drains 516a–c of the switching FETs 510a–c and the output terminal 504. The NOR gate 500 further comprises an enhancement mode pulldown GaAs MESFET 550 having a gate 552 which is connected to the sources 514a–c of the switching FETs 510a–c, a source 554 which is connected to the second voltage supply terminal 508, and a drain 556 which is connected to the output terminal 504.

The NOR gate 500 is essentially the same as the invertor 100 shown in FIG. 3 except that three input terminals 502a–c and three switching FETs 510a–c are provided. When a "logic low" voltage is applied to all input terminals 502a–c, all switching FETs 510a–c are off, so the feedback FET 530 and the pulldown FET 550 are also off. The load FET 520, which is always on, pulls the drains 516a–c of the switching FETs 510a–c toward $V_{DD}$, so that the output terminal 504 is also pulled to a "logic high" level close to $V_{DD}$. When a "logic high" level is applied to one or more of the input terminals 502a–c, the corresponding switching FET or FETs 510 turn on, thereby turning on the feedback FET 530 and the pulldown FET 550. The load FET 520 and the switching FET or FETs 510 which are turned on, feedback FET 530, diode 540, and pulldown FET 550 act as a voltage divider to determine the voltage on the drains 516a–c of the switching FETs 510a–c. The diode 540 and the pulldown FET 550 act as a voltage divider which fixes the voltage on the output terminal 504 at a "logic low" level. The pulldown FET 550 pulls the voltage on the output terminal 504 toward the negative supply voltage $V_{SS}$, and the diode 540 provides the required voltage shift between the drains 516a–c of the switching FETs 510a–c and the output terminal 504. If a greater voltage shift between the drains 516a–c of the switching FETs 510a–c and the output terminal 504 is desired for improved noise margins, the diode 540 can be replaced by a plurality of series connected diodes.

In the invertor 100 and particularly in the NOR gate 500 the feedback FET 130, 530 reduces the temperature sensitivity of the operating characteristics. A temperature shift which increases the source current of the switching FETs 110, 510a–c increases the voltage across the feedback FET 130, 530 to reduce the gate to source voltage of the switching FETs 110, 510a–c. A temperature shift which decreases the source current of the switching FETs 110, 510a–c decreases the voltage across the feedback FET 130, 530 to increase the gate to source voltage of the switching FETs 110, 510a–c. Hence the feedback FET 130, 530 provides a measure of temperature compensation.

While the invention has been described in terms of embodiments employing GaAs MESFETs and is particularly useful when these devices are employed, other types of FETs may be employed. For example, Si or InP MESFETs, or JFETs, HEMTs, HIGFETs or SISFETs may be used.

The invention, which is not limited to the embodiments described above, is defined by the claims which follow.

I claim:

1. A logic gate comprising:
   an input terminal, an output terminal, and first and second voltage supply terminals;
   an enhancement mode switching FET having a gate which is connected to the input terminal, a source and a drain;
   a load device connected between the drain of the switching FET and the first voltage supply terminal;
   a feedback device connected between the source of the switching FET and the second voltage supply terminal;
   a two terminal level shift device connected between the drain of the switching FET and the output terminal; and
   an enhancement mode pulldown FET having a gate connected to the source of the switching FET, a source connected to the second voltage supply terminal, and a drain connected to the output terminal.

2. A logic gate as defined in claim 1, wherein the load device comprises a depletion mode FET having a drain which is connected to the first voltage supply terminal, and a gate and source, both of which are connected to the drain of the switching FET.

3. A logic gate as defined in claim 1, wherein the load device comprises a resistor.

4. A logic gate as defined in claim 3, wherein the load device comprises a nonlinear resistor.

5. A logic gate as defined in claim 1, wherein the feedback device comprises an enhancement mode FET having a source which is connected to the second voltage supply terminal, and a gate and drain, both of which are connected to the source of the switching FET.

6. A logic gate as defined in claim 1, wherein the feedback device comprises a depletion mode FET having a drain which is connected to the source of the switching FET, a source which is connected to the second voltage supply, and a gate which is connected to the second voltage supply.

7. A logic gate as defined in claim 1, wherein the feedback device comprises a diode.

8. A logic gate as defined in claim 1, wherein the feedback device comprises a plurality of diodes connected in series.

9. A logic gate as defined in claim 1, wherein the feedback device comprises a resistor.

10. A logic gate as defined in claim 9, wherein the feedback device comprises a nonlinear resistor.

11. A logic gate as defined in claim 1, wherein the two terminal level shift device comprises a diode.

12. A logic gate as defined in claim 1, wherein the two terminal level shift device comprises a plurality of diodes connected in series.

13. A logic gate as defined in claim 1, wherein the two terminal level shift device comprises a resistor.

14. A logic gate as defined in claim 13, wherein the two terminal level shift device comprises a nonlinear resistor.

15. A logic gate as defined in claim 1, wherein the two terminal level shift device comprises an enhancement mode FET having a gate and a drain both of which are connected to the drain of the switching FET and a source which is connected to the output terminal.

16. A logic gate, comprising:
    a plurality of input terminals, an output terminal, and first and second voltage supply terminals;
    a plurality of enhancement mode switching FETs, each switching FET having a gate connected to a corresponding input terminal, a source and a drain, the sources of the switching FETs being connected to one another and the drains of the switching FETs being connected to one another;
    a load device connected between the drains of the switching FETs and the first voltage supply terminal;
    a feedback device connected between the sources of the switching FETs and the second voltage supply terminal;
    a two terminal level shift device connected between the drains of the switching FETs and the output terminal; and
    an enhancement mode pulldown FET having a gate connected to the sources of the switching FETs, a source connected to the second voltage supply terminal, and a drain connected to the output terminal.

17. An invertor comprising:
    an input terminal, an output terminal, and first and second voltage supply terminals;
    an enhancement mode switching FET having a gate connected to the input terminal, a source and a drain;
    a depletion mode FET having a drain which is connected to the first voltage supply terminal, and a gate and source, both of which are connected to the drain of the switching FET;
    a depletion mode FET having a drain which is connected to the source of the switching FET, and a gate and source, both of which are connected to the second voltage supply terminal;
    a diode connected between the drain of the switching FET and the output terminal; and
    an enhancement mode pulldown FET having a gate connected to the source of the switching FET, a source connected to the second voltage supply terminal, and a drain connected to the output terminal.

18. An invertor as defined in claim 17, wherein the FETs are GaAs MESFETs.

19. A NOR gate comprising:

a plurality of input terminals, an output terminal, and first and second voltage supply terminals;

a plurality of enhancement mode switching FETs, each having a gate connected to a corresponding one of the input terminals, a source connected to the sources of each of the other switching FETs, and a drain connected to the drain of each of the other switching FETs;

a depletion mode FET having a drain which is connected to the first voltage supply terminal, and a gate and source, both of which are connected to the drains of the switching FETs;

a depletion mode FET having a drain which is connected to the sources of the switching FETs, and a gate and source, both of which are connected to the second voltage supply terminal;

a diode connected between the drains of the switching FETs and the output terminal; and an enhancement mode pulldown FET having a gate connected to the sources of the switching FETs, a source connected to the second voltage supply terminal, and a drain connected to the output terminal.

20. A NOR gate as defined in claim 19, wherein the FETs are GaAs MESFETs.

21. A logic gate as defined in claim 1, wherein the feedback device comprises a depletion mode FET having a drain which is connected to the source of the switching FET, a source which is connected to the second voltage supply terminal, and a gate which is connected to the source of the switching FET.

* * * * *